United States Patent
Chen et al.

(10) Patent No.: US 6,703,691 B2
(45) Date of Patent: Mar. 9, 2004

(54) QUAD FLAT NON-LEADED SEMICONDUCTOR PACKAGE AND METHOD OF FABRICATING THE SAME

(75) Inventors: Nan-Jang Chen, Taichung (TW); Kevin Chiang, Taichung (TW); Chien-Ping Huang, Taichung (TW); Tzong-Da Ho, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/991,305

(22) Filed: Nov. 14, 2001

(65) Prior Publication Data

US 2003/0042583 A1 Mar. 6, 2003

(30) Foreign Application Priority Data

Sep. 4, 2001 (TW) .......................... 90121837 A

(51) Int. Cl.⁷ .......................................... H01L 23/495
(52) U.S. Cl. ................ 257/666; 257/787; 438/106; 438/123
(58) Field of Search .............................. 257/666, 787, 257/796, 670, 675, 676; 438/106, 123

(56) References Cited

U.S. PATENT DOCUMENTS

| | | | |
|---|---|---|---|
| 5,519,251 A | 5/1996 | Sato et al. ................ 257/666 |
| 5,703,407 A | 12/1997 | Hori ........................... 257/783 |
| 6,002,181 A | * 12/1999 | Yamada et al. ............. 257/787 |
| 6,008,531 A | * 12/1999 | Brooks et al. .............. 257/691 |
| 6,159,764 A | * 12/2000 | Kinsman et al. ........... 438/106 |

* cited by examiner

*Primary Examiner*—Eddie Lee
*Assistant Examiner*—Douglas W. Owens
(74) *Attorney, Agent, or Firm*—Peter F. Corless; Steven M. Jensen; Edwards & Angell, LLP

(57) ABSTRACT

A QFN (Quad Flat Non-leaded) semiconductor packaging technology is proposed, which can be used to package a semiconductor chip of a central-pad type having at least one row of bond pads arranged along a center line on one surface of the semiconductor chip. The proposed semiconductor packaging technology is based on a specially-designed leadframe which is formed with a plurality of leads, a chip-support-and-grounding structure, and at least one ground wing; wherein the chip-support-and-grounding structure serves both as a die pad and a ground bus for the packaged chip, and the ground wing is electrically linked to the chip-support-and-grounding structure. After encapsulation process is completed, the ground wing as well as the outer lead portions are exposed to the bottom outside of the encapsulation body, which can be then bonded a PCB's ground plane during SMT (Surface Mount Technology) process, thus enhancing the grounding effect and the electrical performance of the packaged chip during operation.

12 Claims, 11 Drawing Sheets

QUAD FLAT NON-LEADED SEMICONDUCTOR PACKAGE AND METHOD OF FABRICATING THE SAME

BACKGROUND OF THE INVENTION

1. Field of the Invention

This invention relates to semiconductor packaging technology, and more particularly, to a QFN (Quad Flat Non-leaded) semiconductor package and method of fabricating the same, which is characterized by that it includes a ground-wing structure which is exposed to the bottom outside of the encapsulation body to help enhance the grounding effect and the electrical performance of the packaged chip during operation.

2. Description of Related Art

QFN (Quad Flat Non-leaded) is an advanced semiconductor packaging technology which is characterized by the provision of non-protruding pins (or called leads) on the bottom side of the encapsulation body, which allows the overall package to be made very compact in size. The QFN technology also allows the die pad to be exposed on the bottom side of the encapsulation body. During SMT (Surface Mount Technology) process when the package is mounted on a printed circuit board (PCB), the exposed die pad can be electrically bonded to the PCB's ground plane, which can help enhance the heat-dissipation efficiency and electrical performance of the packaged chip during operation. For this sake, the QFN technology is particularly useful for the packaging of high-frequency and radio-frequency chips.

One drawback to the conventional QFN technology, however, is that it is unsuitable for the packaging of a semiconductor chip of central-pad type whose I/O pads are located along a center line in the active surface thereof, such as DRAM (Dynamic Random Access Memory) chips.

Related patents, include, for example, the U.S. Pat. No. 5,703,407 entitled "RESIN-SEALED TYPE SEMICONDUCTOR DEVICE"; and the U.S. Pat. No. 5,519,251 entitled "SEMICONDOCTOR DEVICE AND METHOD OF PRODUCING THE SAME"; to name just a few.

The U.S. Pat. No. 5,703,407 discloses an LOC (Lead-On-Chip) type of QFN technology. One drawback to this patented technology, however, is that it provides no exposed die pad on the bottom side of the encapsulation body, so that it would be undesirably poor in grounding effect and heat-dissipation efficiency.

The U.S. Pat. No. 5,519,251 discloses a so-called SON (Small Outline Non-leaded) packaging technology, which is characterized by the use of two leadframes to provide support for the packaged chip and help enhance the heat-dissipation efficiency. One drawback to this patented technology, however, is that it provides no direct coupling between the die pad and PCB's ground plane, resulting in a poor grounding effect to the packaged chip.

SUMMARY OF THE INVENTION

It is therefore an objective of this invention to provide a new QFN semiconductor packaging technology that can be used to package a semiconductor chip of central-pad type.

It is another objective of this invention to provide a new QFN semiconductor packaging technology that allows the packaged chip, particularly high-frequency and radio-frequency chip, to have enhanced grounding effect and electrical performance during operation.

In accordance with the foregoing and other objectives, the invention proposes a new QFN semiconductor packaging technology.

The QFN package structure according to the invention comprises: (a) a leadframe including a plurality of leads, a chip-support-and-grounding structure, and at least one ground wing; wherein the chip-support-and-grounding structure serves both as a die pad and a ground bus, and the ground wing is electrically linked to the chip-support-and-grounding structure; (b) at least one semiconductor chip of central-pad type having an active surface and an inactive surface and having at least one row of bond pads arranged along a center line on the active surface thereof; the semiconductor chip being attached to the leadframe in such a manner that its active surface is adhered to the chip-support-and-grounding structure and its bond pads are aligned to the chip-support-and-grounding structure; (c) a set of bonding wires for electrically coupling the semiconductor chip to the leads; and (d) an encapsulation body for encapsulating the semiconductor chip and the leadframe, while exposing the ground wing as well as the outer portions of the leads to the outside of the encapsulation body.

The QFN packaging process according to the invention comprising the step of: (1) preparing a leadframe including a plurality of leads, a chip-support-and-grounding structure, and at least one ground wing; wherein the chip-support-and-grounding structure serves both as a die pad and a ground bus, and the ground wing is electrically linked to the chip-support-and-grounding structure; (2) attaching the semiconductor chip to the lead-frame in such a manner that the active surface of the semiconductor chip is adhered to the ground bus, and the bond pads thereof are aligned to the chip-support-and-grounding structure; (3) performing a wire-bonding process to bond a set of bonding wires for electrically coupling the semiconductor chip to the leads; and (4) performing an encapsulation process to form an encapsulation body for encapsulating the semiconductor chip and the leadframe, while exposing the ground wing as well as the outer portions of the leads to the outside of the encapsulation body.

The QFN semiconductor packaging technology according to the invention is characterized by that it includes a ground-wing structure which is exposed to the bottom outside of the encapsulation body. This feature can help enhance the grounding effect and the electrical performance of the packaged chip during operation.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The QFN semiconductor packaging technology according to the invention is disclosed in full details by way of preferred embodiments in the following with reference to the accompanying drawings.

Figure 1A:
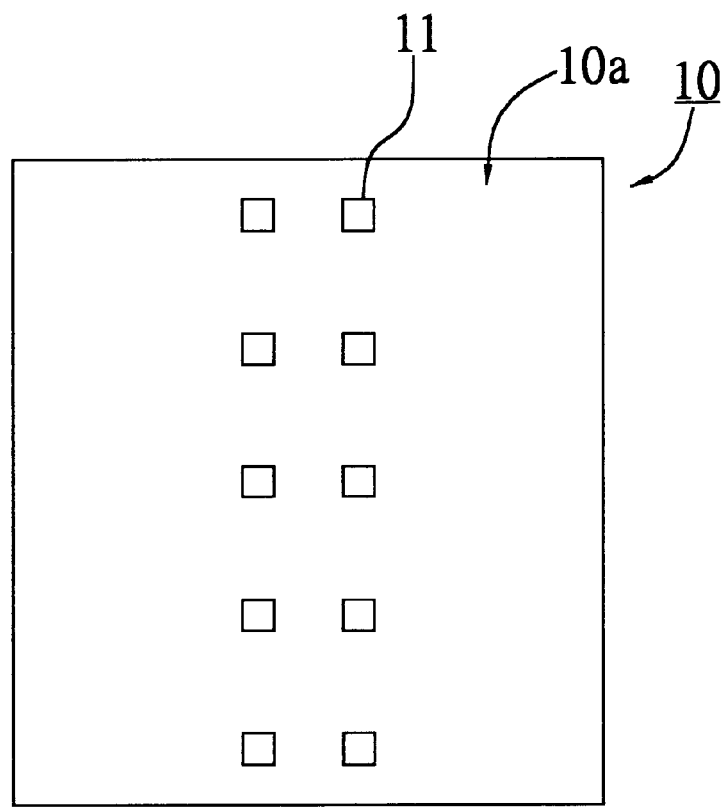
FIG. 1A is a schematic diagram illustrated in top view of a semiconductor chip of central-pad type.
Figure 1B:
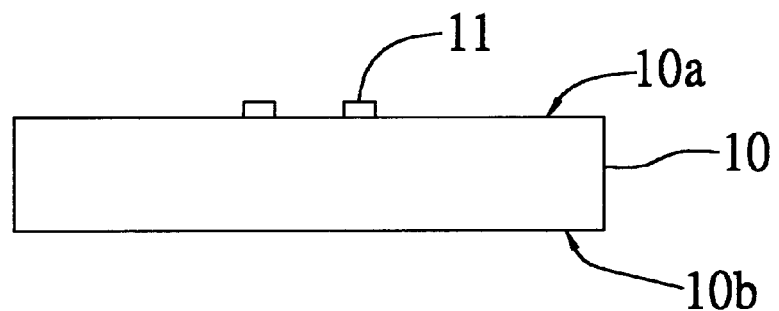
FIG. 1B shows a sectional view of the semiconductor chip of FIG. 1A.

FIG. 1A is a schematic diagram illustrated in top view of a semiconductor chip of central-pad type (which is designated by the reference numeral 10); while FIG. 1B shows a sectional view of the semiconductor chip 10 of FIG. 1A.

Referring to FIGS. 1A–1B, the semiconductor chip 10 has an active surface 10a and an inactive surface 10b and has at least one row of bond pads 11 arranged along a center line on the active surface 10a thereof The bond pads 11 includes signal pads, power pads, and ground pads (not respectively indicated).

Figure 2A:
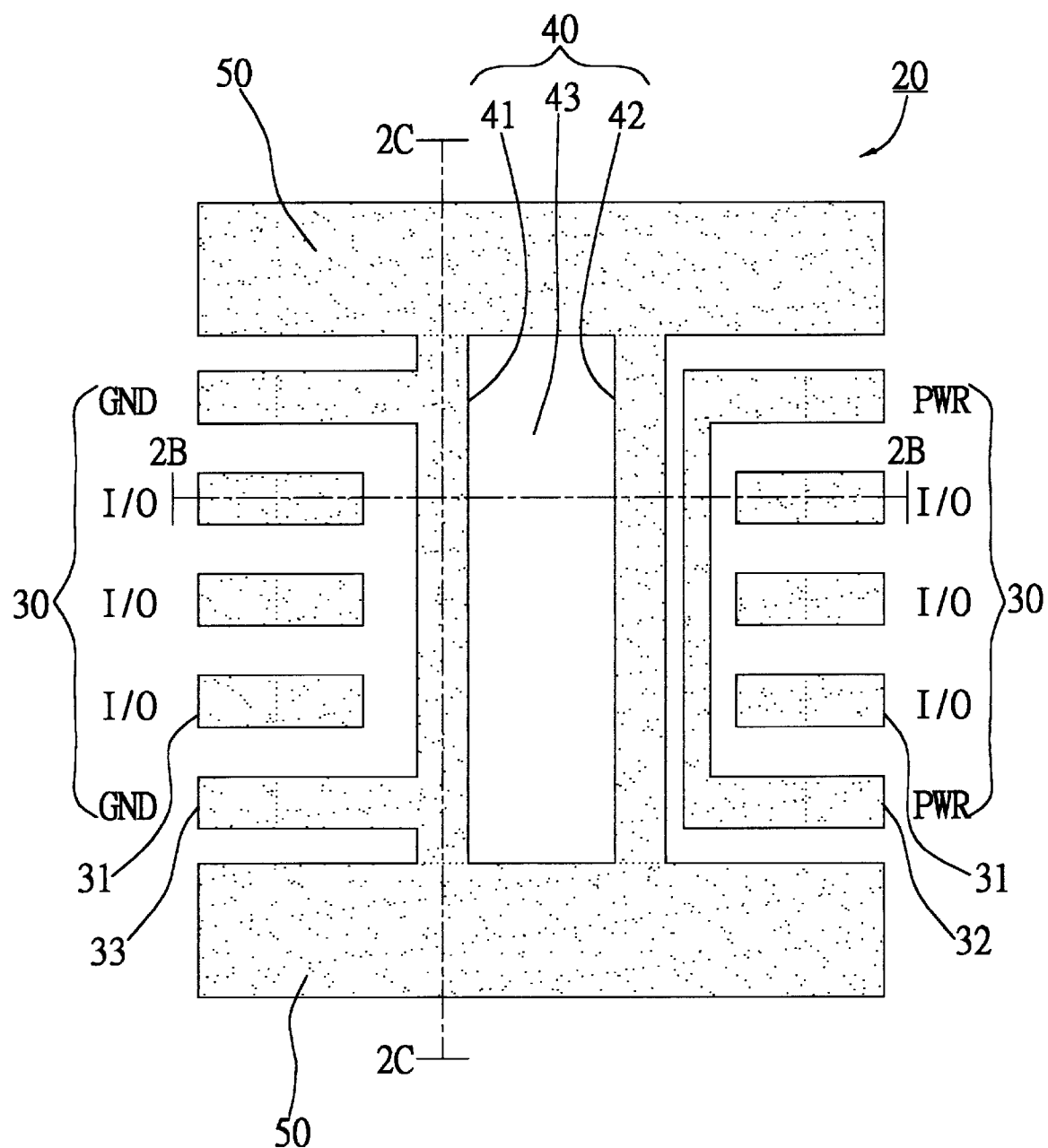
FIG. 2A is a schematic diagram illustrated in top view of a specially-designed leadframe utilized by the QFN semiconductor packaging technology according to the invention.
Figure 2B:
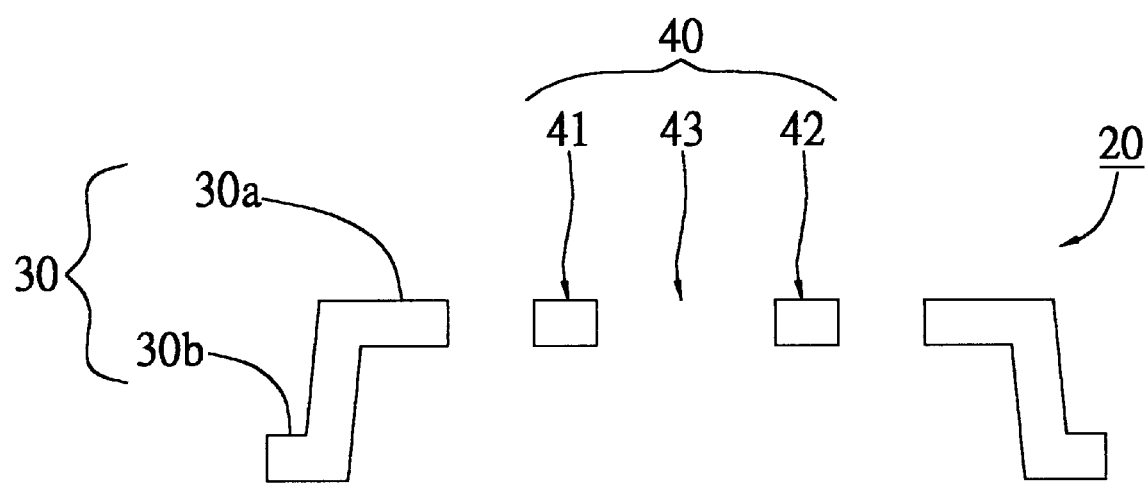
FIG. 2B shows a schematic sectional view of the leadframe of FIG. 2A cutting through the line 2B—2B.
Figure 2C:
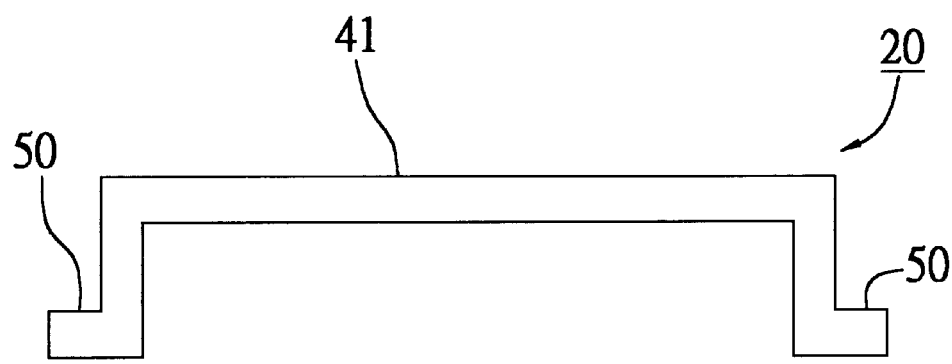
FIG. 2C shows a schematic sectional view of the leadframe of FIG. 2A cutting through the line 2C—2C.

FIG. 2A is a schematic diagram illustrated in top view of a specially-designed leadframe 20 utilized by the QFN semiconductor packaging technology according to the invention; and FIG. 2B shows a schematic sectional view of the leadframe 20 of FIG. 2A cutting through the line 2B—2B; while FIG. 2C shows the same of FIG. 2A cutting through the line 2C—2C.

Referring to FIGS. 2A–2C, in accordance with the invention, the leadframe 20 is used as chip carrier for the central-pad type semiconductor chip 10 shown in FIGS. 1A–1B. As shown, this leadframe 20 includes a plurality of electrically-conductive leads (or called pins) 30, a chip-support-and-grounding structure 40, and a pair of ground wings 50.

The leads 30 are classified according to their respective functions into a subgroup of signal leads (I/O) 31, a subgroup of power leads (PWR) 32, and a subgroup of ground leads (GRD) 33. It is to be noted that FIG. 2A is a simplified schematic diagram showing only a small number of signal leads (I/O) 31, power leads (PWR) 32, and ground leads (GRD) 33 arranged in an arbitrary order for demonstrative purpose, the actual realization of these leads 30 is an arbitrary design choice which may includes a large number of signal, power, and ground leads arranged in a suitable order.

As shown in FIG. 2A and FIG. 2B, the chip-support-and-grounding structure 40 serves both as a die pad and a ground bus for the semiconductor chip 10. Further, the chip-support-and-grounding structure 40 is electrically connected to the ground leads (GRD) 33. As shown in FIG. 2B, the chip-support-and-grounding structure 40 is preferably arranged in the same plane as the inner portions 30a of the leads 30. The chip-support-and-grounding structure 40 is preferably realized in two parallel electrically-conductive ground bars 41, 42 having a gap 43 therebetween. In various other embodiment, the chip-support-and-grounding structure 40 can also include only one ground bar 41; but the provision of two parallel ground bars 41, 42 is more preferable.

The ground wings 50 are electrically linked to the ground bars 41, 42 on the chip-support-and-grounding structure 40 and arranged at a downset position in relation to the ground bars 41, 42 in the same plane as the outer portions 30b of the leads 30.

Figure 3A:
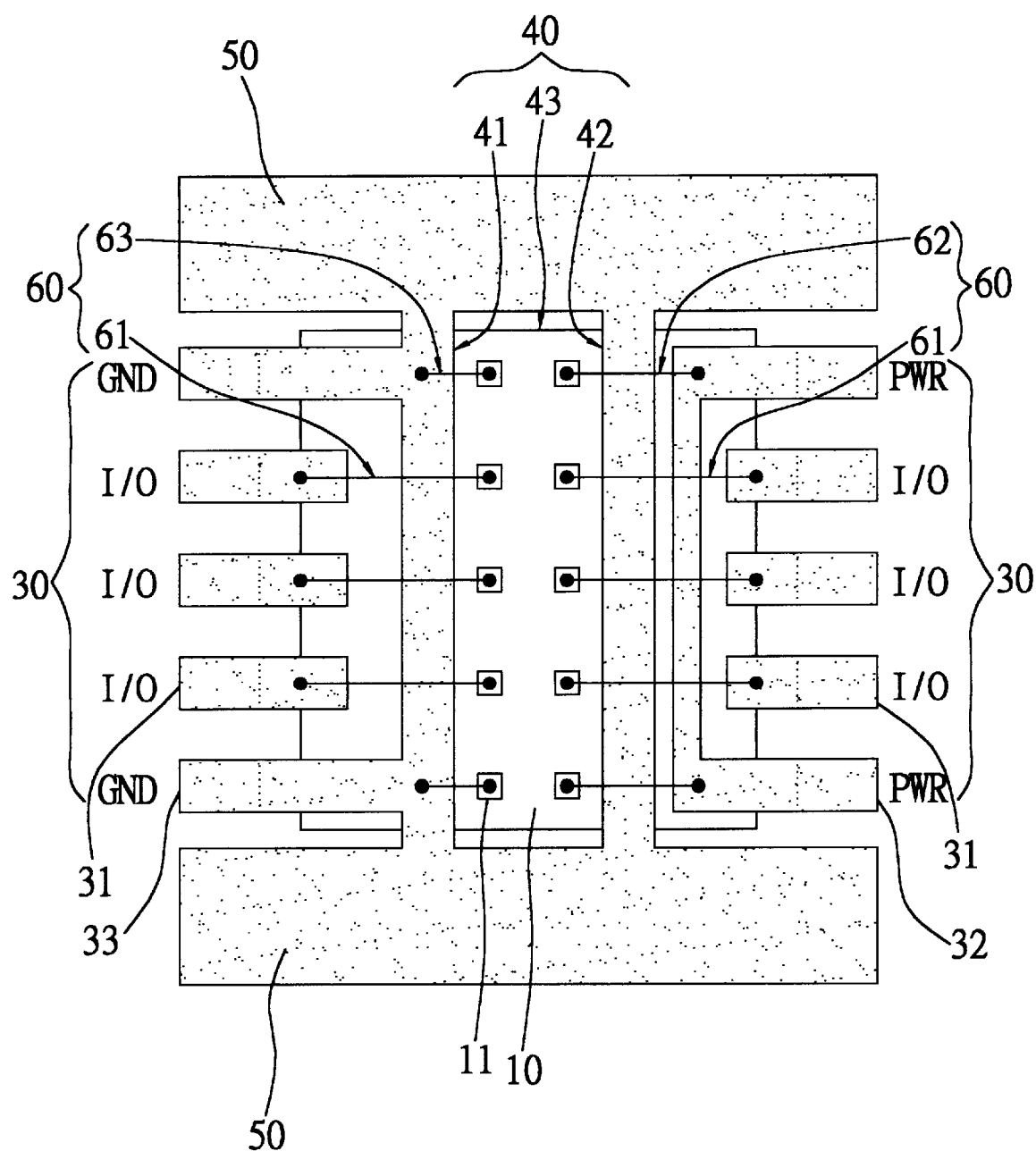
FIG. 3A is a schematic diagram illustrated in top view of a semi-finished package by the QFN semiconductor packaging technology according to the invention.
Figure 3B:
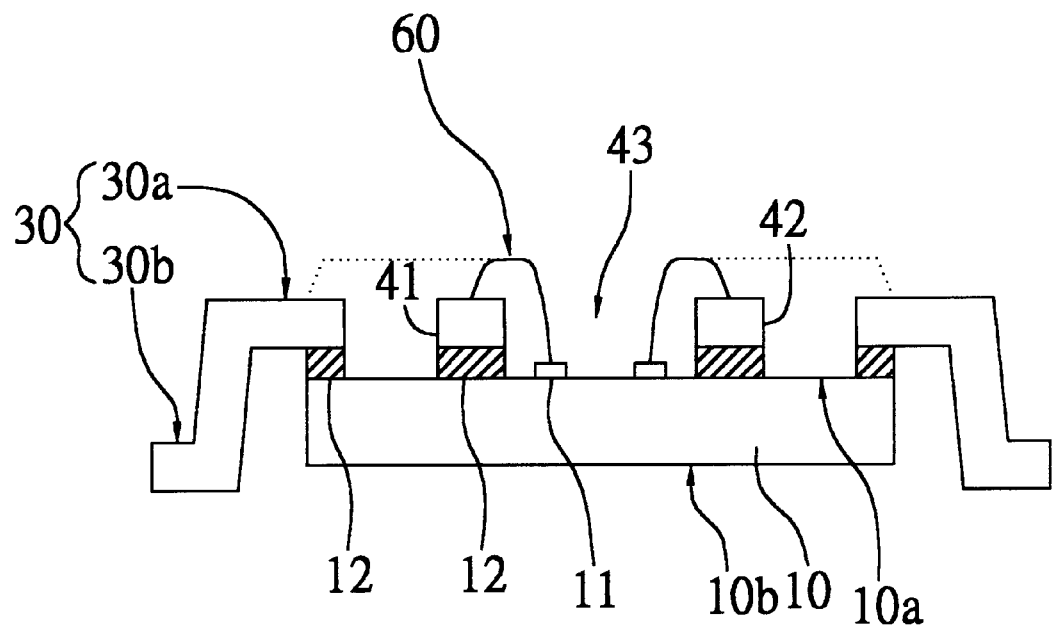
FIG. 3B shows a sectional view of the semi-finished package of FIG. 3A.
Figure 3C:
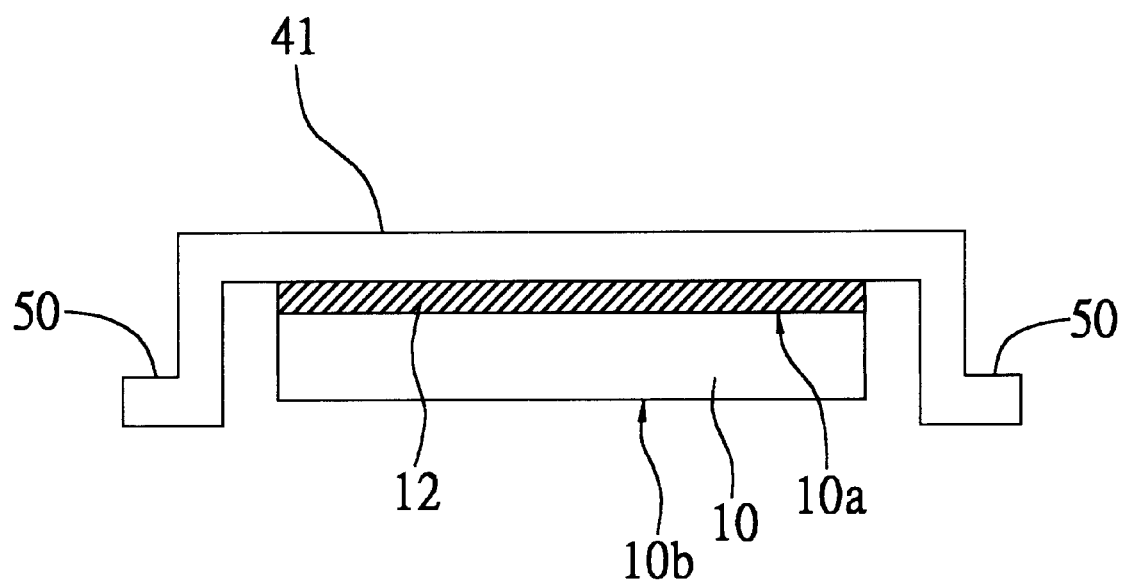
FIG. 3C shows another sectional view of the semi-finished package of FIG. 3A.

Referring further to FIGS. 3A–3C, the next step is to perform a die-attachment process, wherein the semiconductor chip 10 is attached to the leadframe 20 in such a manner that its bond pads 11 are aligned to the gap 43 between the two ground bars 41, 42 on the chip-support-and-grounding structure 40, and its active surface 10a is adhered by means of an adhesive layer 12, such as silver epoxy, to the back of the ground bars 41, 42 and preferably also to the back of the inner portions inner portions 30a of the leads 30.

Next, a wire-bonding process is performed to bond a set of bonding wires 60 for electrically coupling the semiconductor chip 10 to the leads 30, which include a subset of I/O wires 61 bonded to the signal leads (I/O) 31, a subset of power wires 62 bonded to the power leads (PWR) 32, and a subset of ground wires 63 bonded to the ground bars 41, 42 which are further linked to the ground wings 50 and the ground leads (GRD) 33.

Figure 4A:
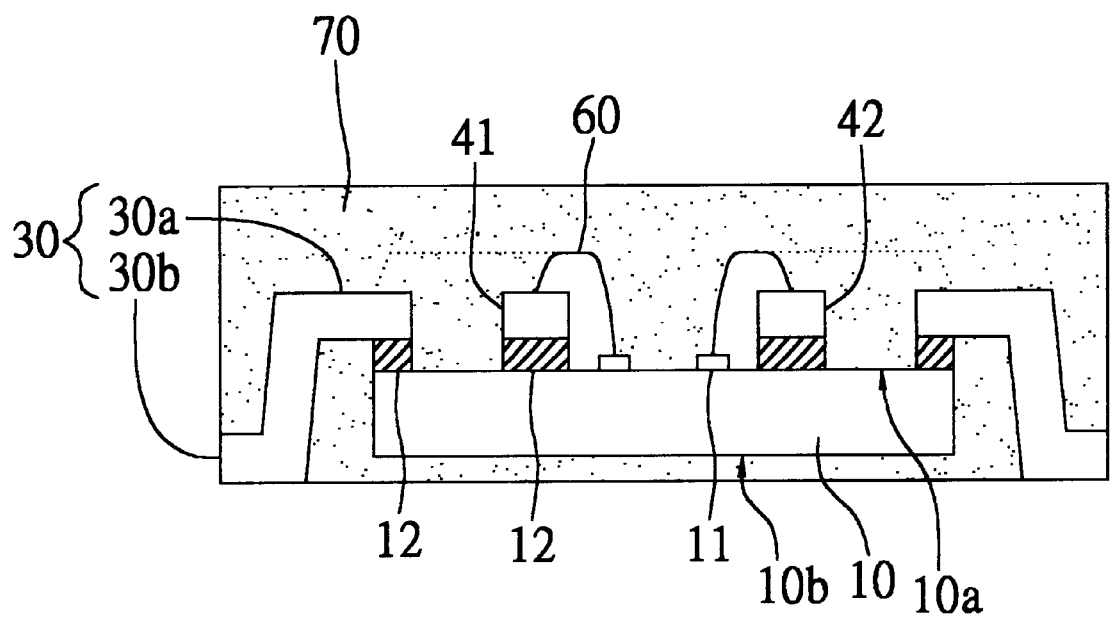
FIG. 4A shows a sectional view of the finished QFN package fabricated by the QFN semiconductor packaging technology according to the invention.
Figure 4B:
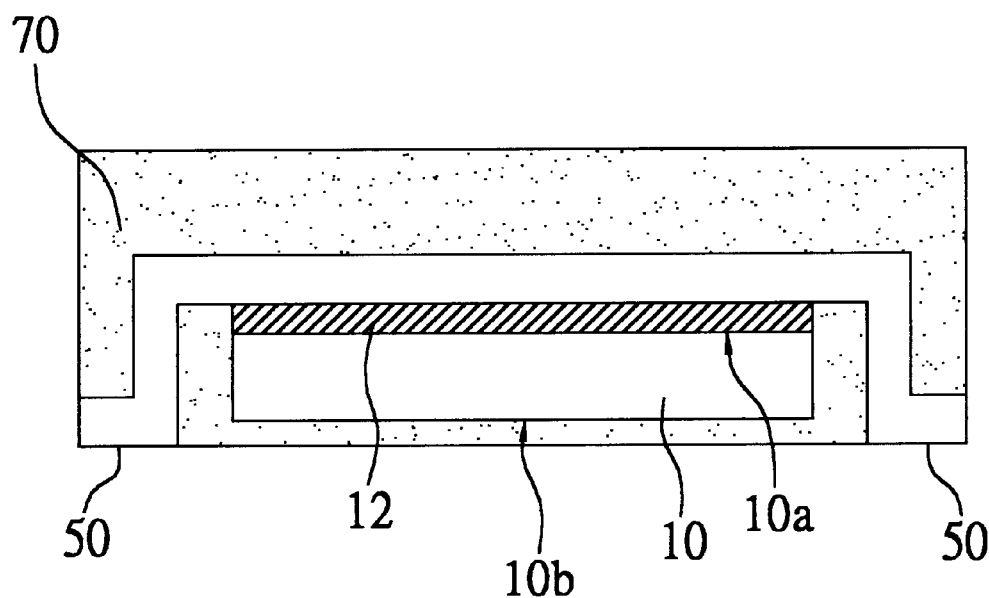
FIG. 4B shows another sectional view of the finished QFN package fabricated by the QFN semiconductor packaging technology according to the invention.
Figure 4C:
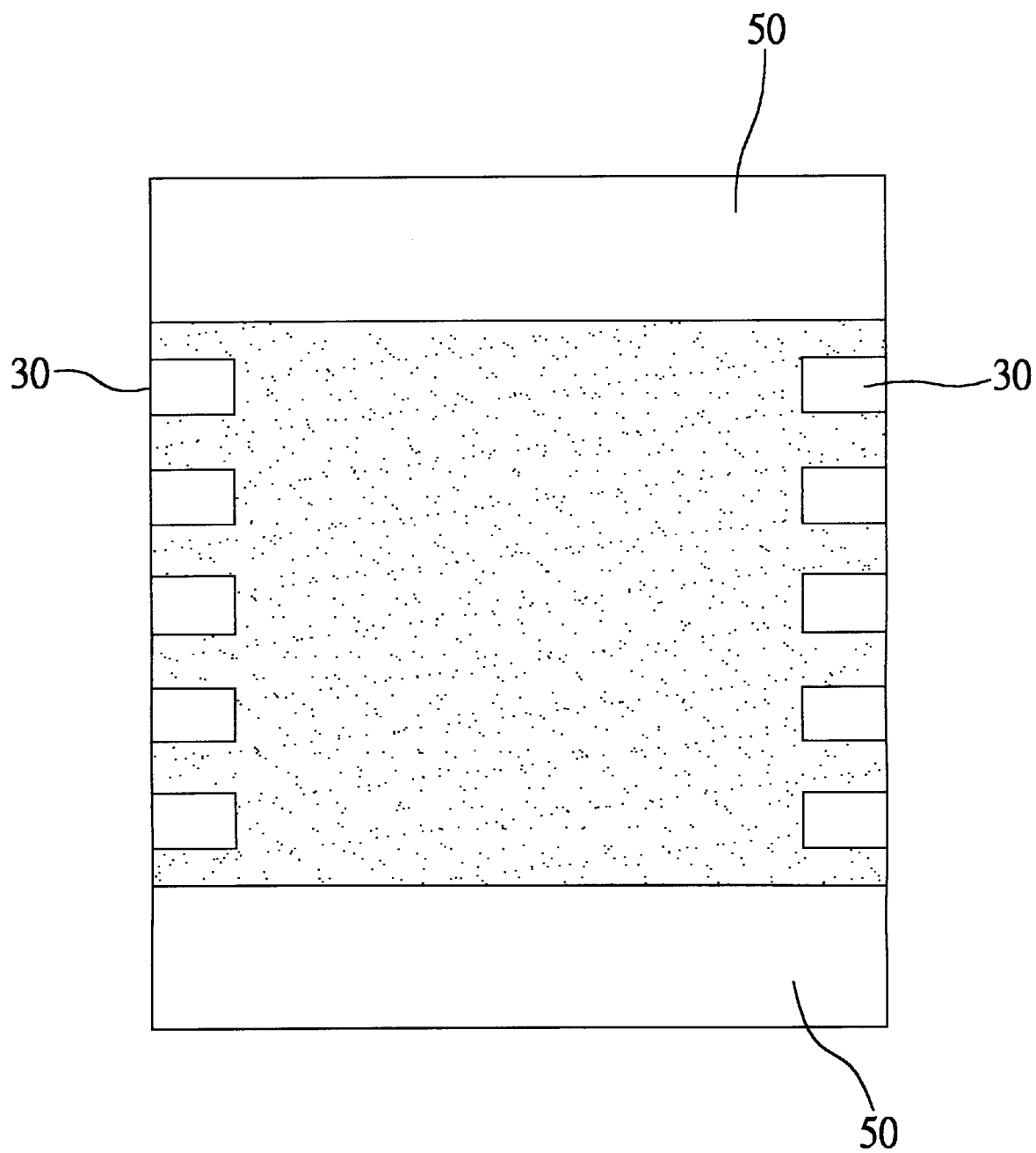
FIG. 4C shows a bottom view of the finished QFN package fabricated by the QFN semiconductor packaging technology according to the invention.

Referring to FIGS. 4A–4C, in the next step, an encapsulation process is performed to form an encapsulation body 70 to encapsulate the semiconductor chip 10 and the leadframe 20, while exposing the bottom surfaces of the ground wings 50 as well as the bottom surfaces of the outer portions of the leads 30 to the bottom outside of the encapsulation body 70 (note that in this embodiment, the inactive surface 10b of the semiconductor chip 10 is unexposed to the bottom outside of the encapsulation body 70). This completes the fabrication of the QFN package.

It can be clearly seen from the illustration of FIG. 4C that the QFN semiconductor packaging technology according to the invention allows the ground wings 50 to be exposed to the bottom outside of the encapsulation body 70 to help enhance the grounding effect and the electrical performance of the packaged semiconductor chip 10 during operation.

Figure 5A:
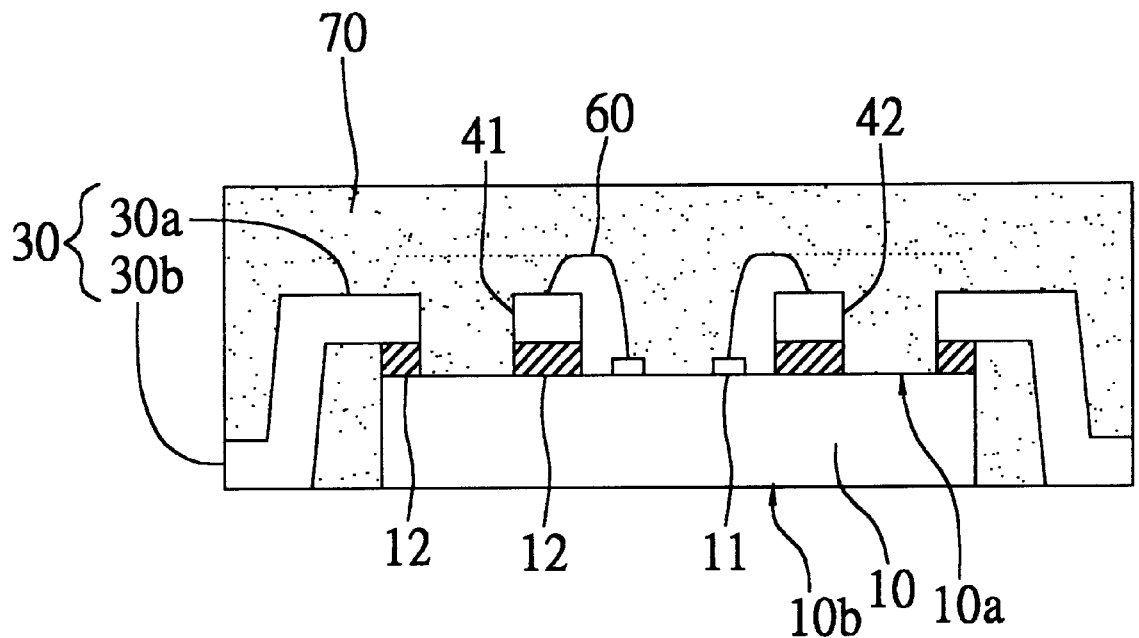
FIGS. 5A–5C show another embodiment of the invention.
Figure 5B:
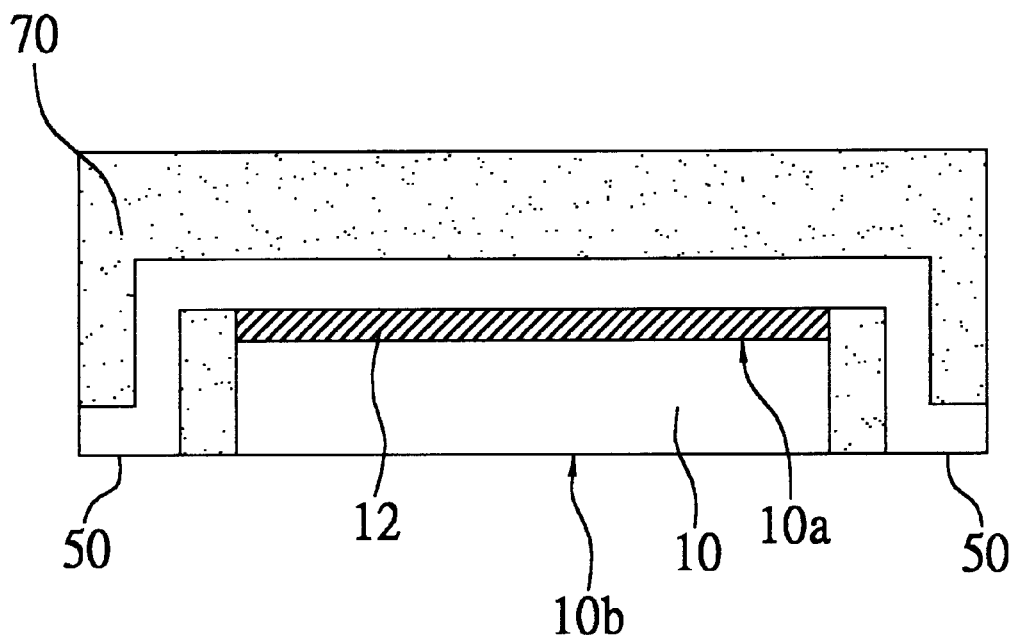
Figure 5C:
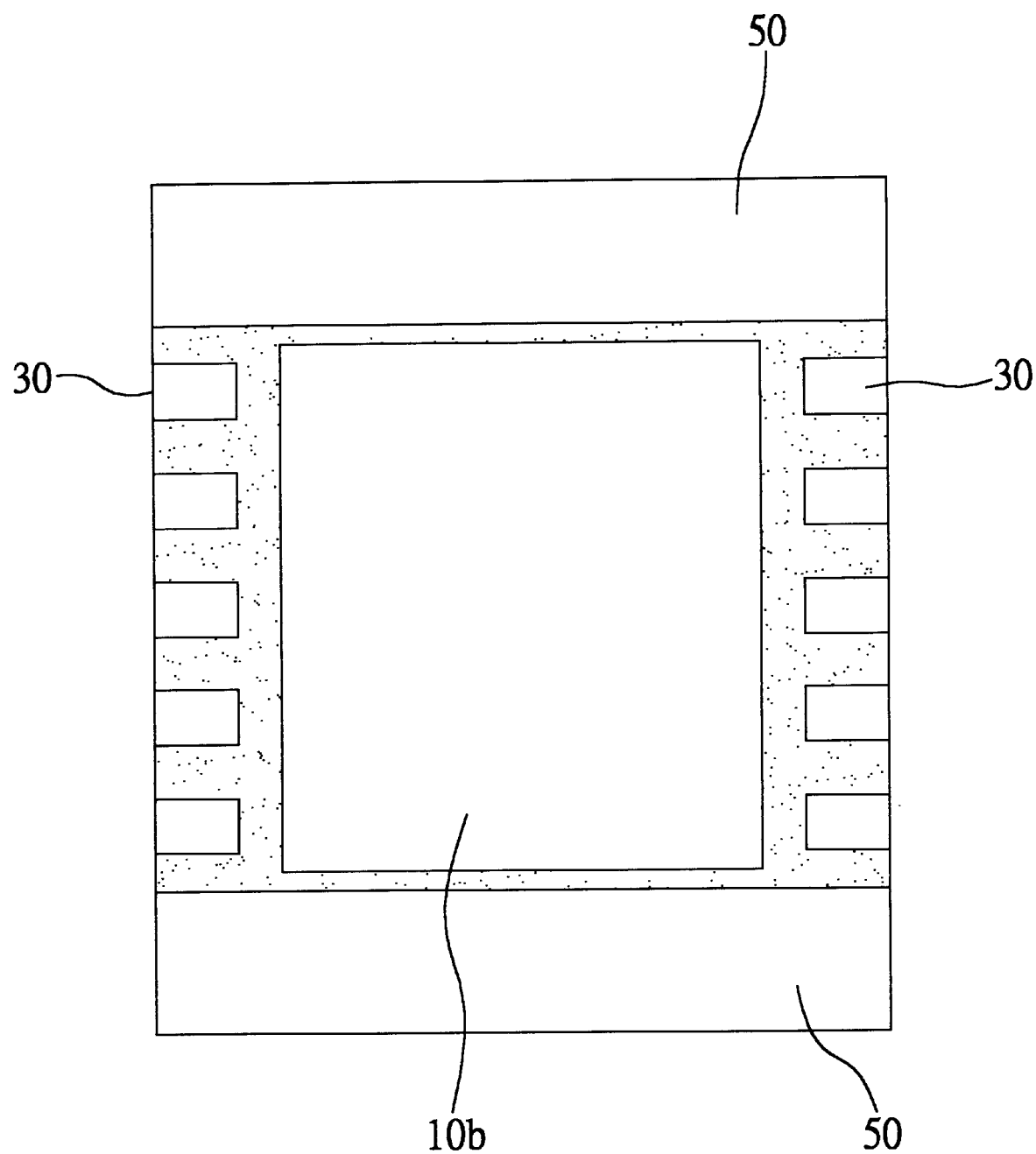

FIGS. 5A–5C disclose another embodiment of the invention, which is substantially the same as the embodiment shown in FIGS. 4A–4C except that here in this embodiment, the inactive surface 10b of the semiconductor chip 10 is exposed to the bottom outside of the encapsulation body 70. During SMT process, the inactive surface 10b of the semiconductor chip 10 as well as the ground wings 50 can be bonded to the PCB's ground plane (not shown), which can further enhance the grounding effect and the electrical performance of the packaged semiconductor chip 10 during operation.

Figure 6A:
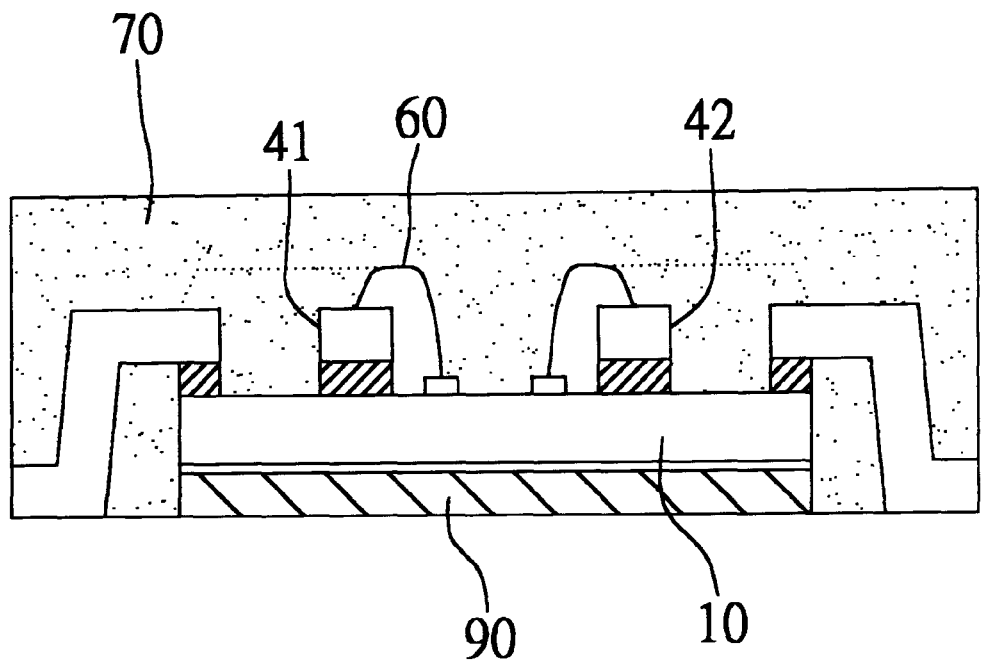
FIGS. 6A–6C show still another embodiment of the invention.
Figure 6B:
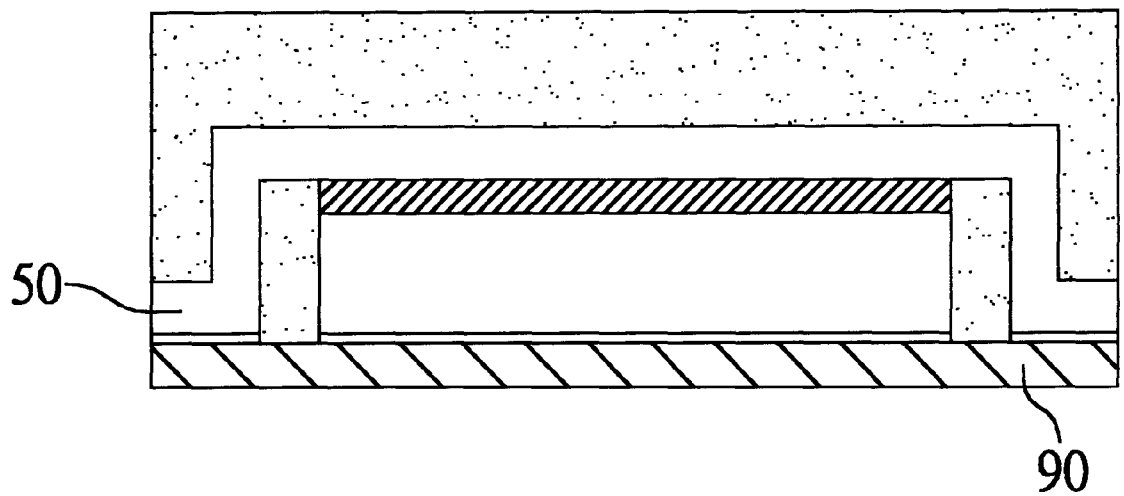
Figure 6C:
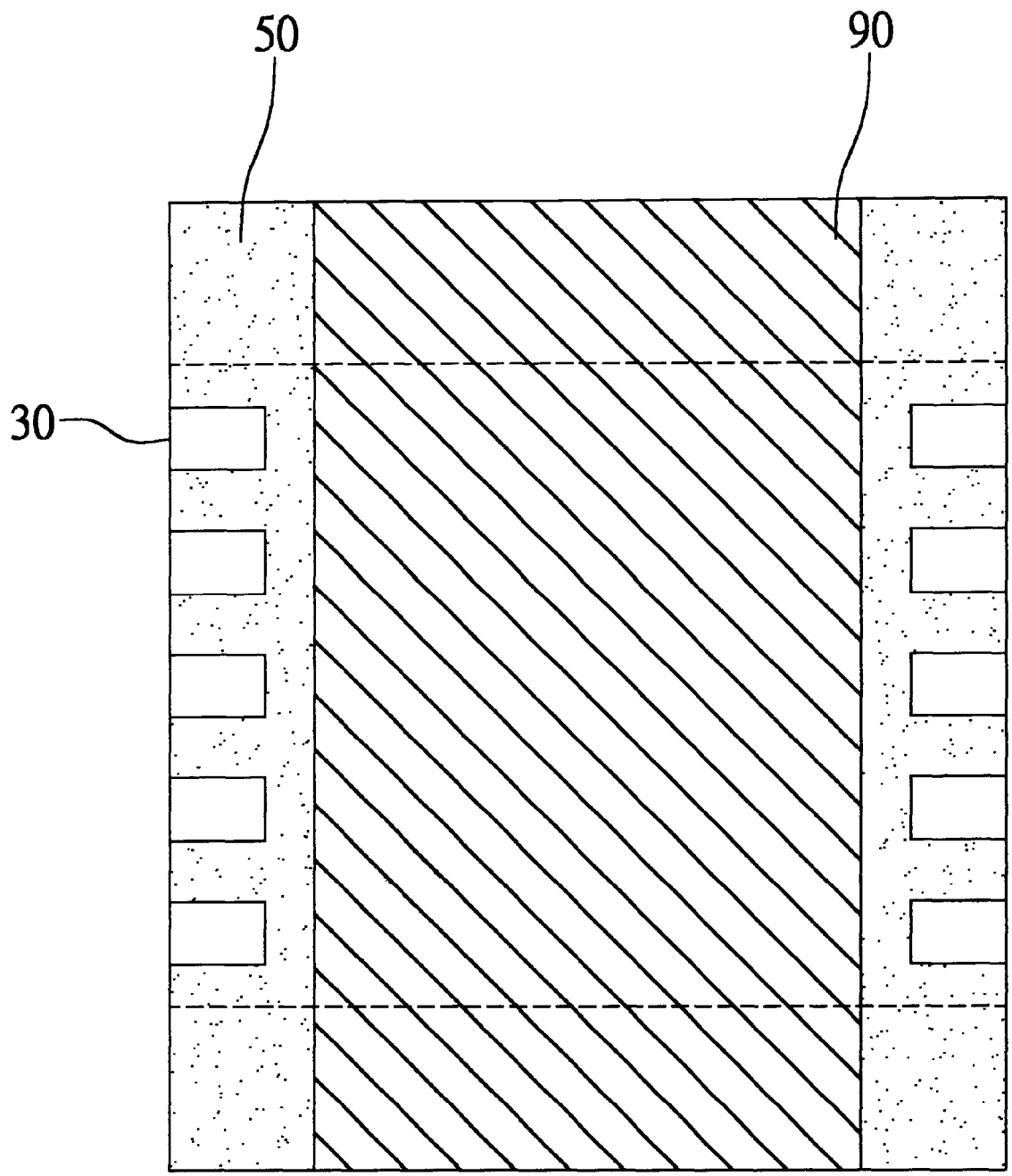

FIGS. 6A–6C disclose another embodiment of the invention, which is substantially the same as the embodiment shown in FIGS. 4A–4C except that here in this embodiment, a heat sink 90 is additionally provided, which is attached to the inactive surface 10b of the semiconductor chip 10 as well as to the bottom surfaces of the ground wings 50. This can help enhance heat-dissipation efficiency of the packaged semiconductor chip 10. Due to these benefits, the invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, which comprises:
    (a) a leadframe including a plurality of leads, a chip-support-and-grounding structure, and at least one ground wing, wherein the chip-support-and-grounding structure serves both as a die pad and a ground bus, and the ground wing is electrically linked to the chip-support-and-grounding structure, and wherein the chip-support-and-grounding structure includes a pair of ground bars having a gap therebetween;
    (b) at least one semiconductor chip of central-pad type having an active surface and an inactive surface and having at least one row of bond pads arranged along a center line on the active surface thereof, the semiconductor chip being attached to the leadframe in such a manner that its active surface is adhered to the chip-support-and-grounding structure and its bond pads are aligned to and exposed via the gap between the pair of ground bars of the chip-support-and-grounding structure;
    (c) a set of bonding wires for electrically coupling the semiconductor chip to the leads, wherein a subset of the bonding wires are connected from selected ones of the bond pads to the chip-support-and-grounding structure; and
    (d) an encapsulation body for encapsulating the semiconductor chip and the leadframe, while exposing the ground wing as well as the outer portions of the leads to the outside of the encapsulation body.

2. The semiconductor package of claim 1, wherein the leads include a group of signal leads, a group of power leads, and a group of ground leads, wherein the ground leads are electrically linked to the ground bus.

3. The semiconductor package of claim 2, wherein the bonding wires include:
    a subset of signal wires connected from selected ones of the bond pads of the semiconductor chip to the signal leads of the leads;
    a subset of power wires connected from selected ones of the bond pads of the semiconductor chip to the power leads; and
    a subset of grounding wires connected from selected ones of the bond pads of the semiconductor chip to the ground bars on the chip-support-and-grounding structure so as to be further electrically connected to the ground wing and the ground leads.

4. The semiconductor package of claim 1, wherein the semiconductor chip is a DRAM chip.

5. The semiconductor package of claim 1, wherein the inactive surface of the semiconductor chip is exposed to outside of the encapsulation body.

6. The semiconductor package of claim 1, further comprising:
    a heat sink, which is attached to the inactive surface of the semiconductor chip as well as to the ground wing, for providing a heat-dissipation path to the semiconductor chip.

7. A method for packaging a semiconductor chip of a central-pad type having an active surface and an inactive surface and further having at least one row of bond pads arranged along a center line on the active surface of the semiconductor chip, the method comprising the steps of:
    (1) preparing a leadframe of the type including a plurality of leads, a chip-support-and-grounding structure, and at least one ground wing, wherein the chip-support-and-grounding structure serves both as a die pad and a ground bus, and the ground wing is electrically linked to the chip-support-and-grounding structure, and wherein the chip-support-and-grounding structure includes a pair of ground bars having a gap therebetween;
    (2) attaching the semiconductor chip to the leadframe in such a manner that the active surface of the semiconductor chip is adhered to the chip-support-and-grounding ground bus, and
    the bond pads thereof are aligned to and exposed via the gap between the pair of ground bars of the chip-support-and-grounding structure;
    (3) performing a wire-bonding process to bond a set of bonding wires for electrically coupling the semiconductor chip to the leads, wherein a subset of the bonding wires are connected from selected ones of the bond pads to the chip-support-and-grounding structure; and
    (4) performing an encapsulation process to form an encapsulation body for encapsulating the semiconductor chip and the leadframe, while exposing the ground wing as well as the outer portions of the leads to the outside of the encapsulation body.

8. The method of claim 7, wherein the leads include a group of signal leads, a group of power leads, and a group of ground leads, wherein the ground leads are electrically linked to the ground bus.

9. The method of claim 8, wherein the bonding wires include:
    a subset of signal wires connected from selected ones of the bond pads of the semiconductor chip to the signal leads of the leads;
    a subset of power wires connected from selected ones of the bond pads of the semiconductor chip to the power leads; and
    a subset of grounding wires connected from selected ones of the bond pads of the semiconductor chip to the ground bars on the chip-support-and-grounding structure so as to be further electrically connected to the ground wing and the ground leads.

10. The method of claim 7, wherein the semiconductor chip is a DRAM chip.

11. The method of claim 7, wherein in said step (4), the inactive surface of the semiconductor chip is exposed to outside of the encapsulation body.

12. The method of claim 7, further comprising the step of:
    attaching a heat sink to the inactive surface of the semiconductor chip as well as to the ground wing.

* * * * *